(12) United States Patent
Fukui et al.

(10) Patent No.: US 7,060,345 B2
(45) Date of Patent: Jun. 13, 2006

(54) COATED TOOL

(75) Inventors: Haruyo Fukui, Itami (JP); Kazuo Yamagata, Itami (JP); Keiichi Tsuda, Itami (JP); Shinya Imamura, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 204 days.

(21) Appl. No.: 10/250,240

(22) Filed: Jun. 17, 2003

(65) Prior Publication Data

US 2004/0018393 A1 Jan. 29, 2004

(30) Foreign Application Priority Data

Jul. 11, 2002 (JP) .................................... 2002-203324

(51) Int. Cl.
*B23B 27/14* (2006.01)

(52) U.S. Cl. .................... 428/216; 51/307; 51/309; 428/325; 428/336; 428/469; 428/472; 428/697; 428/698; 428/699

(58) Field of Classification Search ............... 428/216, 428/336, 325, 697, 698, 699, 472, 469; 51/307, 51/309
See application file for complete search history.

(56) References Cited

U.S. PATENT DOCUMENTS 5,182,238 A * 1/1993 Holleck .................. 428/698
5,580,653 A * 12/1996 Tanaka et al. ............ 428/699
5,882,778 A    3/1999 Sugizaki et al.
6,231,969 B1 * 5/2001 Knight et al. ............ 428/697
6,586,122 B1 * 7/2003 Ishikawa et al. .......... 428/698

FOREIGN PATENT DOCUMENTS

| EP | 0-592-986 A1 | 4/1994 |
|---|---|---|
| EP | 0-701-982 A1 | 3/1996 |
| EP | 0-714-719 A1 | 6/1996 |
| EP | 0-885-984 A2 | 12/1998 |
| JP | 54-158778 | * 12/1979 |
| JP | 04-285033 | * 10/1992 |
| JP | 2793773 | 11/1995 |
| JP | H08-118106 A | 5/1996 |
| JP | H08-134629 | 5/1996 |
| JP | H08-134635 | 5/1996 |
| JP | 09-011004 A | 1/1997 |
| JP | 2001-121314 A | 5/2001 |
| JP | 2002-018606 A | 1/2002 |
| JP | 2003-231004 | 8/2003 |

* cited by examiner

*Primary Examiner*—Archene Turner
(74) *Attorney, Agent, or Firm*—James Judge

(57) ABSTRACT

Coating-film furnished coated tools that are lubricative while maintaining resistance to wear are realized by coated tools in which a plurality of coating films is furnished on a base part. Furnished as the coating are one or more layers of, respectively: a first film composed of one compound selected from nitrides, carbides, carbonitrides, oxynitrides and carboxynitrides of TiSi; and a second film composed of one compound selected from nitrides, carbides, carbonitrides, oxynitrides and carboxynitrides of one metal M selected from Ti, Cr, and TiCr. The first film and the second film are laminated in alternation.

16 Claims, 3 Drawing Sheets

FIG. 1A
FIG. 1B
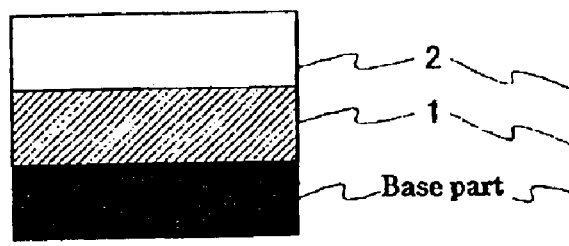
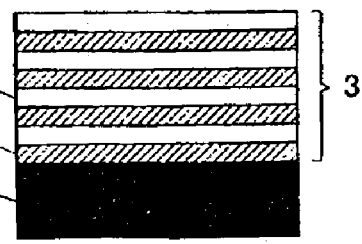
FIG. 1C
FIG. 1D
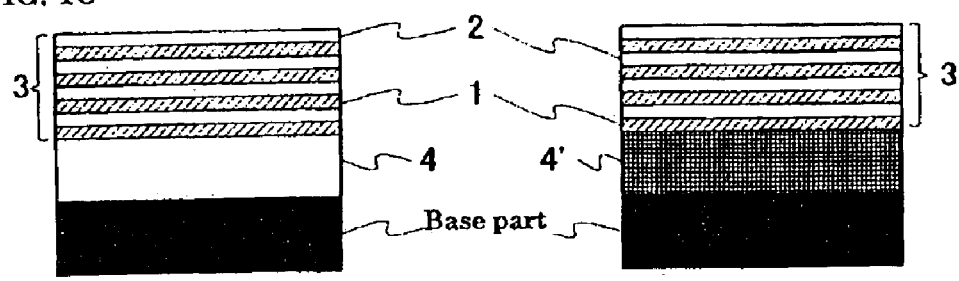
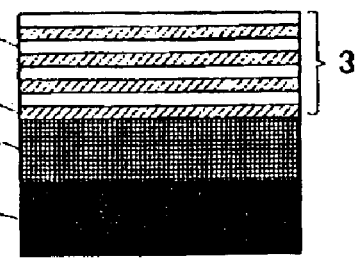
FIG. 1E
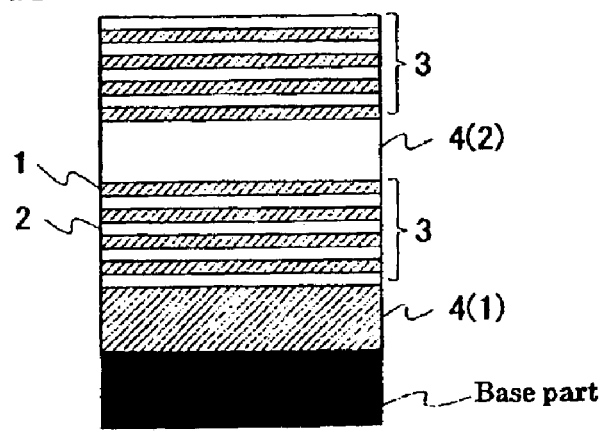

COATED TOOL

BACKGROUND OF INVENTION

1. Field of the Invention

The present invention relates to coated tools in which a multilayer coating film is furnished on a base part such as a drill, endmill, indexable insert for milling, indexable insert for turning, metal slitting saw, gear cutting tool, reamer, or tap. The invention relates in particular to coated tools, furnished with multilayer coating films, that are lubricative while maintaining resistance to wear.

2. Description of the Background Art

Forming a monolayer- or multilayer-hard film composed of carbides, nitrides or carbonitrides of titanium, hafnium, zirconium or titanium aluminide on the surface of a base part composed of WC-based cemented carbide, cermet, or high-speed steel, in order to improve the wear resistance and surface-guarding capability of machine tools and wear-resistant tools has been well known to date.

Nevertheless, recent trends such as those listed below are leading to a tendency for tool cutting-edge temperatures in machining to be hotter and hotter, and to ever more severe demands on the characteristics of the tool materials.

(1) From the viewpoint of global environmental protection, dry-work processes that do not employ cutting fluids (lubricants) are being sought;
(2) Work materials are being diversified; and
(3) Machining speeds are being accelerated in order to enhance process efficiency all the more.

In particular, film stability at high temperatures (anti-oxidation properties and bondability with respect to base parts) has of course been a characteristic demanded of tool materials; but in relation to tool life, enhancement of wear-resistance—i.e., film hardness at high temperatures—and lubricating characteristics of film substituting for lubricants have become even more crucial.

To address such issues, the creation of a TiAlSi-based film—$(Al_xTi_{1-x-y}Si_y)(N_zC_{1-z})$, wherein $0.05 \leq x \leq 0.75$, $0.01 \leq y \leq 0.1$, and $0.06 \leq z \leq 1$—is proposed in Japanese Pat. No. 2,793,773. Through incorporating trace amounts of Si into a film, this technology lends the film favorable anti-oxidation properties and a high degree of hardness, and serves to enhance its anti-wear resistance.

Likewise, the creation of a TiSi-based film—$(Ti_{1-x}Si_x)(C_{1-y}N_y)_z$, wherein $0.01 \leq x \leq 0.45$, $0.01 \leq y \leq 0.1$, and $0.5 \leq z \leq 1.34$—is proposed in Japanese Pat. App. Pub. No. H08-118106. By coating tools with highly hard $(Ti_{1-x}Si_x)(C_{1-y}N_y)_z$, this technology makes tool wear-resistance outstanding even in continuous high-speed machining and serves to prolong useable tool life.

With the foregoing conventional technology have been the following problems, however.

The case with the technology in Japanese Pat. No. 2,793,773 is that aluminum is incorporated into the film, and under high temperatures in excess of 900° C. the aluminum in the film surface takes precedence in binding oxygen, forming $Al_2O_3$. The problem thus is that the titanium remaining disperses within the film, forming extremely porous titanium oxides and impairing the wear resistance of the film.

With the technology in Japanese Pat App. Pub. No. H08-118106, the downside of the high degree of hardness to $(Ti_{1-x}Si_x)(C_{1-y}N_y)_z$ is the problem that owing to its extreme brittleness, if it is employed in machine tools—especially if employed in interrupted cutting—the cutting edge is liable to chip.

What is more, no study whatsoever regarding the film lubricating qualities that would be an issue in dry working is made in either Japanese Pat No. 2,793,773 or Pat. App. Pub. No. H08-118106.

SUMMARY OF INVENTION

A principal object of the present invention is therefore to realize coated tools that have a high degree of hardness and superior wear resistance, and that are superiorly lubricative.

The present inventors, gaining the knowledge in attaining the above-stated object that advantageous is a structure in which highly hard, superiorly wear-resistant films and superiorly lubricative films are laminated in alternation onto a base part, set out the present invention.

In particular, the present invention is a coated tool in which a plurality of coating films is furnished on a base part. Furnished as the coating are one or more layers of each of: a first film composed of one compound (TiSi-based compound) selected from nitrides, carbides, carbonitrides, oxynitrides and carboxynitrides of TiSi; and a second film composed of one compound (metal-M compound) selected from nitrides, carbides, carbonitrides, oxynitrides and carboxynitrides of one metal M selected from Ti, Cr, and TiCr. The first film and the second film are then laminated in alternation.

The present invention as a coating overall is lent a combination of highly hard, superiorly wear-resistant and lubricative properties by being one or more of, respectively, a very highly hard, superiorly wear-resistant film of a TiSi-based compound (first film), laminated in alternation with a superiorly lubricative film of a metal-M compound (second film).

Further, although the metal-M compounds with lubricative effects are of lower hardness compared with TiSi-based compounds, because the compressive stress they leave in a coating is low, if combined with a film of a TiSi-based compound they make for reducing residual stress in the coating overall. This consequently makes it possible with tools in the present invention to curb incidents of film peeling off from, and chipping of, the cutting edge during work such as interrupted cutting in which the cutting edge is subject to shock. What is more, among the metal-M compounds coating films of Cr-based compounds especially are suited to application in automotive parts and the like, because of their low friction coefficient and superior anti-scorch properties.

From the following detailed description in conjunction with the accompanying drawings, the foregoing and other objects, features, aspects and advantages of the present invention will become readily apparent to those skilled in the art.

BRIEF DESCRIPTION OF DRAWINGS

FIG. 1 is schematic diagrams illustrating coating configurations for tools in the present invention, wherein: 1A is a bi-layer structure of first and second films; 1B is a plural-layer laminate of first and second films; 1C is a configuration in which one part is a monolayer made up of first-film and second-film constituent components, and the other part is a plural-layer laminate structure made up of first and second films; 1D is a configuration in which one part is a monolayer made up of intermediate layers and publicly known films, and the other part is a plural-layer laminate structure made up of first and second films; and 1E is a configuration in which plural-layer laminate structures made up of first and second films are flanked by monolayers.

DETAILED DESCRIPTION

Figure 2A:
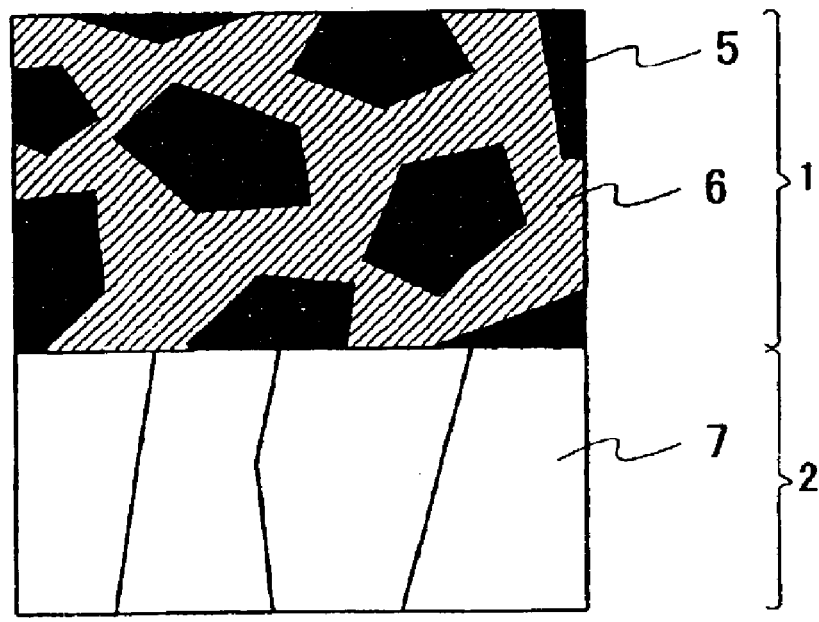
FIG. 2 is schematic diagrams illustrating film microstructural composition, wherein 2A represents a tool by the present invention and 2B, a conventional tool.

The present invention will be explained in more detail in the following.

In tools by the present invention, a number of configurations, illustrated in FIG. 1, are conceivable for organizing the first film composed of a TiSi-based compound and the second film composed of a metal-M compound. FIG. 1A is a bi-layer structure of first film 1 and second film 2, and FIG. 1B is a plural-layer laminate structure 3 of first films 1 and second films 2. Other examples that may be given are: as shown in FIG. 1C, a configuration in which one part is a monolayer 4 made up of first-film 1 and second-film 2 constituent components, and the other part is plural-layer laminate structure 3 made up of first films 1 and second films 2; as shown in FIG. 1D, a configuration in which one part is a monolayer 4' made up of later-described intermediate layers and publicly known films, and the other part is plural-layer laminate structure 3 made up of first films 1 and second films 2; and as shown in FIG. 1E, a configuration in which plural-layer laminate structures 3 made up of first films 1 and second films 2 are flanked by monolayers 4. Represented in FIG. 1C is a film made up of second-film 2 constituent components as the monolayer 4; in FIG. 1D, a publicly known film such as a TiAlN film for example, as the monolayer film 4'; and in FIG. 1E, a film made up of second-film 2 constituent components as the upper monolayer 4, and a film first-film 1 constituent components as the lower monolayer 4. It should be understood that the laminating sequence may be with either the first film or the second film along the base part.

The thickness of the first film composed of a TiSi-based compound and the thickness of the second film composed of a metal-M compound preferably are, respectively, 0.5 nm or more and 50 nm or less. A structure in which such thin films are laminated is effective in controlling dislocation and cracking. With film thicknesses of less than 0.5 nm, gaining enhanced coating hardness is unlikely. Likewise, if less than 0.5 nm, the chemical elements constituting the coating disperse, seriously destabilizing the structure of the films, risking that the laminated structure of the thin films will be extinguished or that neighboring films will bond, making the film interfaces indistinguishable. On the other hand, with film thicknesses in excess of 50 nm, the effectiveness in controlling displacement and cracking thanks to the laminated structure of the thin films is liable to decline. More preferable is that the thicknesses be respectively 0.5 nm or more, 10 nm or less.

The Si in the first film composed of a TiSi-based compound is preferably more than 1%, and 30% or less, in atomic weight %. Si being present within the coating is desirable because it enhances the coating hardness, but incorporating more than 30% Si in atomic weight % risks that the coating will turn brittle, and from the opposite perspective, that its propensity to wear down will be hastened. Furthermore, in a situation in which in forming the first film by physical vapor deposition a target of a TiSi alloy (evaporation source material) is to be fabricated by hot isostatic pressing, incorporating over 30% Si will break the target, impeding the production of material strength usable for a coating. More preferably over 15%, and 25% or less, Si in atomic weight % is incorporated in the first film.

It is preferable that in the first film the Ti-based compound (one compound selected from nitrides, carbides, carbonitrides, oxynitrides and carboxynitrides) is a cubic (isometric) crystalline structure, and the Si-based compound (one compound selected from nitrides, carbides, carbonitrides, oxynitrides and carboxynitrides) is an amorphous structure, and that in the second film the metal-M compound is a cubic crystalline structure. Although in this case the crystallinity of the coating overall can be evaluated by X-ray diffraction assay, the Si-based compound cannot be identified by X-ray diffraction because it is amorphous. The fact thus that by X-ray diffraction assay of the coating overall only the Ti-based compound—which possesses a cubic crystalline structure—within the first film composed of the TiSi-based compound, and the metal-M compound—which also possesses a cubic crystalline structure—within the second film can be identified means that as a result the structure of the coating overall is a cubic crystal system. It should be understood that in a case in which the later-described intermediate layers are furnished in addition to the coating composed of the first film and the second film, the overall film structure furnished also with the intermediate layers will be a cubic crystal system. It should also be understood that evaluation of the crystallinity of the Si-based compound can be made by, for example, transmission electron diffraction.

Figure 2B:
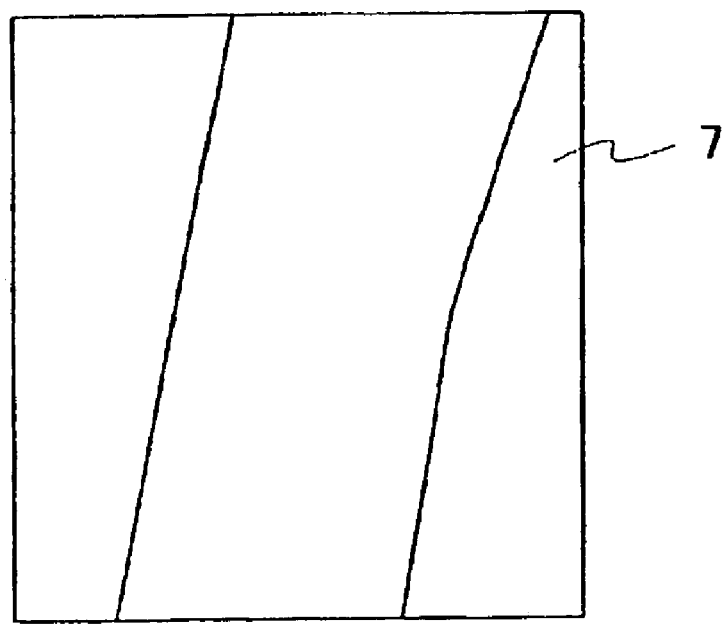

The Ti-based compound in the first film preferably is a crystalline substance whose average grain size is 0.1 nm or more, 10 nm or less, and preferably is dispersed within the amorphous structure of the Si-based compound. Reference is made to FIG. 2, schematic diagrams illustrating coating-film microstructural compositions, wherein 2A represents a tool by the present invention and 2B, a conventional tool. As shown in FIG. 2A, with a tool by the present invention minute crystal grains 5 of the Ti-based compound in the first film are in a state in which they are dispersed within the amorphously structured Si-based compound 6. The so-called nanosize effect from the crystal grains of the Ti-based compound thus being nanometer sized prevents damage by yielding elevation in coating hardness and efficacy in controlling displacement and cracking. With the conventional tool in contrast, because the microstructural makeup of the coating as a whole turns out to be so-called columnar microstructures 7, as shown in FIG. 2B, the vertical microstructures 7 are each liable to fall out if cracking occurs, damaging the coating, i.e., making it prone to wear. Again in the present invention, since the crystalline Ti-based compound and the amorphous Si-based compound are in a blended phase, the first film can disperse energy to curtail the propagation of cracks that would advance into the coating, which serves to enhance the wear resistance further. What is more, though the first film, a blended phase of the crystalline Ti-based compound and the amorphous Si-based compound, is laminated in alternation with the second film, composed of a metal-M compound, the coating as a whole will not turn into columnar microstructures as is the case with the conventional tool coatings, and its fine-grain microstructure will therefore be sustained.

Meanwhile, although compared with the first film, composed of the TiSi-base compound, the hardness of the second film, composed of a metal compound, is some 30% lower, with scorching on steels often employ ed as work materials being slight, the second film is lubricative. The fact that tools by the present invention can consequently have a better ability to discharge swarf even in dry-work processes makes it possible to hold down elevation in cutting-edge temperature, slow the speed of tool damage, and design for prolonged tool life. Here, the second film preferably has columnar microstructures 7 as indicated in FIG. 2A.

The compounded thickness of the coating constituted from such first and second films is preferably 0.5 µm or more and 10 µm or less. This is because enhanced wear resistance is unlikely to be gained at compounded thickness of less than 0.5 µm, and compounded thickness in excess of 10 µm risks that the strength with which the coating bonds to the base part will decline due to the influence of residual stress within the coating.

An intermediate layer may be furnished in between the surface of the base part and the foregoing coating in tools by the present invention. The intermediate layer may be composed of one selected from Ti (titanium), TIN (titanium nitrides), Cr (chromium), and CrN (chromium nitrides). With titanium and titanium nitrides in particular, inasmuch as the adhesion both with the base-part surface and the coating is good, these materials can enhance the adhesion between the base part and the coating all the more. Furnishing the intermediate layer just noted can therefore control peeling of the coating from the base part and further enhance tool life. The thickness of such intermediate layer is preferably 0.05 µm or more and 1.0 µm or less. This is because enhanced the adhesion is unlikely to be gained at thicknesses of less than 0.05 µm, and further improvement in adhesion is unrecognizable at thicknesses in excess of 1 µm.

The base part on which the foregoing coatings and intermediate layer are formed preferably is one selected from cemented tungsten carbides, cermets, high-speed steels, ceramics, sinters of cubic boron nitride (cBN), diamond sinters, silicon nitride sinters, and sinters containing alumina and titanium carbide.

Inasmuch as they are composed of a solid phase whose chief component is tungsten carbide (WC), and a bonded phase whose chief component is an iron-family metal such as cobalt (Co), routinely used cemented tungsten carbides may be utilized. In addition, they may contain a solid solution composed of at least one selected from family 4a, 5a and 6a transition metals in the periodic table of the elements, and at least one selected from carbon, nitrogen, oxygen and boron. The solid solution may be, to name examples, (Ta, Nb)C, VC, $Cr_2C_2$, and NbC.

The cermets may be made up of a solid-solution phase composed of at least one selected from family 4a, 5a and 6a transition metals in the periodic table of the elements, and at least one selected from carbon, nitrogen, oxygen and boron; a bonded phase composed of one or more iron-based metals: and unavoidable impurities. Routinely used cermets may therefore be utilized.

The high-speed steels may be, to give examples: in JIS notation, SKH2, SKH5, SKH10, SKH9, SKH52, and SKH56.

Examples of ceramics that may be cited are: silicon carbide, silicon nitride, aluminum nitride, and alumina.

The cBN sinters may be, to name an example, those containing 30 volume % or more cBN. To be more specific, the following sinters are enumerated.

(1) Sinters containing 30 volume % or more and 80 volume % or less cBN, with the remainder being composed of a bonding material, an iron-family metal, and unavoidable impurities. The bonding material contains: at least one selected from the group consisting of nitrides, borides and carbides of family 4a, 5a and 6a elements in the periodic table, as well as solid solutions of these; and an aluminum compound.

The cBN particles in the cBN sinters noted above are bonded primarily via the abovementioned bonding materials, which have a low affinity for iron, often employed as a work material, and because these bonds are strong, the wear resistance and strength of the base part are enhanced.

The cBN content is made 30 volume % or more because at less than 30 volume % the hardness of the cBN sinter starts to decline, and for machining a highly hard work material such as tempered steel the hardness would be insufficient. The cBN content is made 80 volume % or less because in a cBN sinter in which the content exceeds 80 volume %, with bonding between the cBN particles via the bonding material proving problematic, there is a concern lest the strength deteriorate.

(2) Sinters containing 80 volume % or more and 90 volume % or less cBN, wherein the cBN particles bind to one another, with the remainder being composed of a bonding material and unavoidable impurities. Aluminum compounds or cobalt compounds are made the chief component of the bonding material.

By carrying out liquid-phase sintering with, as a starting material, a metal that includes Al or Co, which act as a catalyst, or an intermetallic compound, the cBN particles in this cBN sinter can be made to bind together and the cBN-particle inclusion ratio can be raised. Although the wear resistance of the cBN sinter is apt to be less, because the cBN particles together form a strong structural framework, the sinter is made superiorly fracture resistant to enable machining under harsh conditions.

The cBN content is made 30 volume % or more because at less than 80 volume % formation of the structural framework by the bonding together of the cBN particles proves to be difficult. The cBN content is made 90 volume % or less because at more than 90 volume %, un-sintered portions arise from a shortage of the above-note bonding material acting as a catalyst, owing to which the strength of the cBN sinter declines.

The diamond sinters may be, to name an example, those containing 40 volume % or more diamond. To be more specific, the following sinters are enumerated.

(1) Sinters containing 50 to 98 volume % diamond, with the remainder being composed of an iron-family metal, tungsten, and unavoidable impurities. The iron-family metal is preferably cobalt especially.

(2) Sinters containing 85 to 99 volume % diamond, with the remainder being made up of voids, tungsten, and unavoidable impurities.

(3) Sinters containing 60 to 95 volume % diamond, with the remainder being composed of a bonding material and unavoidable impurities. The bonding material contains: an iron-family metal; one or more selected from the group consisting of carbides and carbonitrides of family 4a, 5a and 6a elements in the periodic table; and tungsten.

(4) Sinters containing 60 to 98 volume % diamond, with the remainder being composed of at least one of silicon and silicon carbide, and tungsten and unavoidable impurities.

The silicon-nitride sinters may be, to give an example, those containing 90 volume % or more silicon nitride. Especially preferable is a sinter containing 90 volume % or more silicon nitride that has been bonded together employing the HIP method (hot isostatic sintering method). The remainder of this sinter preferably is made up of: a bonding material composed of at least one selected from alumina, aluminum nitride, yttrium oxide, magnesium oxide, zirconium oxide, hafnium oxide, rare earth elements, TiN and TiC; and unavoidable impurities.

Sinters containing alumina and titanium carbide may be, to give examples, sinters containing, in volume %, 20% or more and 80% or less alumina, and 15% or more and 75% or less titanium carbide, with the remainder being composed of: a bonding material that is at least one selected from oxides of Mg, Y, Ca, Zr, Ni, Ti and TiN; and unavoidable impurities. Especially preferable is the alumina being 65 volume % or more and 70 volume % or less, the titanium carbide being 25 volume % or more and 30 volume % or less, and the bonding material being at least one selected from oxides of Mg, Y and Ca.

Coated tools by present invention may be employed in applications including one selected from drills, endmills, indexable inserts for milling, indexable inserts for turning, metal slitting saws, gear cutting tools, reamers, and taps.

To coat the coating films in the present invention onto the base part, they are suitably produced by a deposition process that allows a highly crystalline compound to be created. In that case, the coating made up of the foregoing first and second films is preferably formed by physical vapor deposition, with a TiSi alloy and a metal M each as an evaporation source material, within a gas containing one or more among nitrogen, carbon and oxygen. Furthermore, as a result of investigating various deposition methods the present inventors found that arc-ion plating deposition (cathodic arc ion plating) in which the proportion of raw-material elemental ions is high, stands out among physical vapor deposition techniques as optimally suitable. Utilizing cathodic arc ion plating enables treating the surface of the base part before forming the coating films by bombarding it with metal ions, which can therefore markedly enhance the coating-film bondability, and which is therefore a desirable process from the viewpoint of bondability.

The TiSi-alloy evaporation source material utilized in the foregoing physical vapor deposition technique is created by hot isostatic pressing and is of 99 to 100% relative density, and is preferably one in which ranging continuously over the surface of the source material including its countering face there are no defects such as pores and cracks, for example. These conditions make it possible to prevent trouble during film deposition such as the target (evaporation material) breaking.

Embodiments of the present invention will be explained in the following.

The coated tool set forth below was fabricated and its wear resistance reviewed.

Embodiment 1
(1) Test-Sample Fabrication
i. Present-Invention Products: Test Sample Nos. 1-1 Through 1-8

Figure 3A:
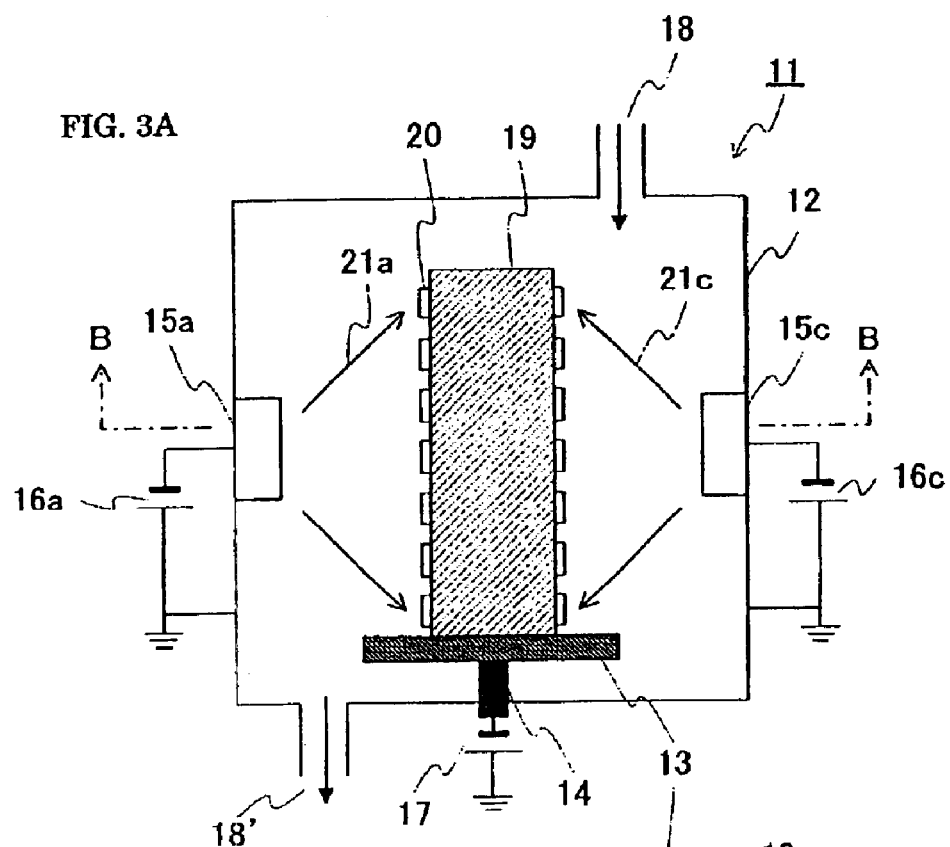
FIG. 3 is diagrams representing a film-deposition device, wherein 3A is a schematic diagram of the film-deposition device and 3B is a sectional view through B—B in FIG. 3A.

The film-deposition device utilized in the present test will first be explained. Reference is made to FIG. 3A, a schematic diagram of the film-deposition device utilized in the present test, and to FIG. 3B, a sectional view through B—B In FIG. 3A. The film-deposition device is in a chamber 12 equipped with: a main table 13 on which a substrate 19 is loaded and which is mounted rotatively on a support post 14; arc-evaporation sources 15a, 15b and 15c arranged along the walls of the chamber 12 so as to surround the substrate 19; dc-power supply 16a, 16b (not illustrated) and 16c as variable power supplies connected to the evaporation sources 15a, 15b and 15c; dc-power supply 17 connected to the main table 13; a gas introduction port 18 through which gas is supplied; and a gas discharge port 18' through which gas is exhausted.

The chamber 12 is coupled to a vacuum pump (not illustrated), whereby the chamber 12 internal pressure can be changed. A rotary shaft (not illustrated) through which the main table 13 is rotated is provided inside the support post 14. A sample holder 20 for retaining the substrate 19 is provided over the main table 13. The main table 13, the support post 14, and the sample holder 20 are electrically connected with the negative pole of dc-power supply 17, while the positive pole of dc-power supply 17 is grounded. The arc-evaporation sources 15a, 15b and 15c are electrically connected with the negative poles of dc-power supply 16a, 16b and 16c, while the positive poles of dc-power supply 16a, 16b and 16c are both grounded and electrically connected to the chamber 12.

Figure 3B:
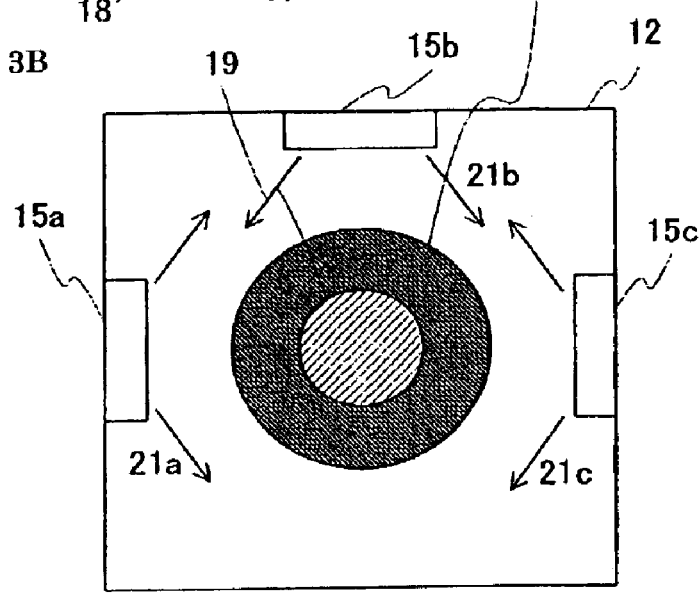

Are discharging between the arc-evaporation sources 15a, 15b and 15c, and the chamber 12 then partially melts the arc-evaporation sources 15a, 15b and 15c, vaporizing the cathodic substances in the directions indicated by the arrows 21a, 21b and 21c shown in FIG. 3B, whereby a coating film is formed on the substrate 19 surface. Meanwhile a variety of gases are introduced through the gas introduction port 18 via mass-flow controller (not illustrated). The gases may be, to name examples, inert gases such as argon or nitrogen gas, and hydrocarbon gases such as methane, acetylene or benzene. To produce a discharge in this film-deposition device a voltage of some several dozen to several hundred V is applied across the arc-evaporation sources 15a, 15b and 15c, and the chamber 12.

The film-deposition method for Test Sample Nos. 1-1 through 1-8 will be explained in the following. As the substrates, an insert conforming in shape to Japan Industrial Standard (JIS) SPGN 120308 was prepared from JIS P30-grade cemented carbide. Then, utilizing the film-deposition device 11 illustrated in FIG. 3, while rotating the main table 13 the substrate 19 in the form of an insert was heated to a temperature of 550° C. with a heater (not illustrated), and the pressure within the chamber 12 was brought down to $1.3 \times 10^{-3}$ Pa by evacuating it with the vacuum pump.

Next, cleaning of the substrate 19 surface was carried out for 15 minutes by introducing argon gas through the gas introduction port 18, holding the pressure within the chamber 12 at 3.0 Pa, and gradually raising the voltage from dc-power supply 17 until it was −1000 V. Afterwards the argon gas was discharged through the gas discharge port 18'.

With the voltage from dc-power supply 17 maintained still at −1000 V, 100 sccm of an argon-and-nitrogen gas mixture was introduced into the chamber 12 through the gas introduction port 18. A 150-A arc current was then supplied from dc-power supply 16a to cause metal ions to issue from the arc-evaporation source 15a. The metal ions from the arc-evaporation source 15a are sputtered onto the substrate 19 surface by this process, which removes strong soiling and oxide films present on the substrate 19 surface. Here, in the present example, the metals and compounds applicable to forming respectively the intermediate layer, first film and second film set forth in later-described Table I were used as the evaporation source materials in the arc-evaporation sources 15a, 15b and 15c. In this example furthermore, the first film-having a relative density of 99.8%, having been manufactured by hot isostatic pressing-was created utilizing as an evaporation source material a TiSi-alloy in which ranging continuously over the surfaces of the source material including its countering face there were no defects.

Nitrogen gas was thereafter introduced through the gas introduction port 18 so as to bring the pressure within the chamber 12 to 2.7 Pa, and the voltage from dc-power supply 17 was set to −80 V. The forming of a metal nitride film or of a metal film on the substrate 19 surface would thus begin. This situation was maintained until the metal nitride film (e.g., TiN or the like) or the metal film (e.g., Ti or the like) had reached a predetermined thickness (0.3 μm). Through this process, a metal nitride film (e.g., a TiN or like film) or a metal film (e.g., a Ti or like film) as an intermediate layer was formed.

After formation of the foregoing intermediate layer was finished, with the state within chamber—pressure: 2.7 Pa, nitrogen gas being introduced, voltage from dc-power supply 17: −80 V—left as it was, a −40 V, 95 A current was supplied from each of dc-power supply 16b and 16c to the arc-evaporation sources 15b and 15c. Thus metal ions were vaporized from arc-evaporation source 15b in the directions indicated by the arrows 21b, while chemical-compound ions were vaporized from arc-evaporation source 15c in the directions indicated by the arrows 21c, forming a coating film of predetermined thickness on the substrate 19 surface, where by Test Sample Nos. 1-1 through 1-8 were produced. It will be appreciated that in Test Sample Nos. 1-1 through 1-8 conceivable configurations for the coatings made up of the first and second films are the configurations depicted in FIG. 1.

ii. Conventional Product: Test Sample No. 1-9

Test Sample No. 1-9 was fabricated as follows. First, for the substrate, the same tool as for Test Sample Nos. 1-1 through 1-8 was readied. The substrate was set into the sample holder 20 in the film-deposition device 11 depicted in FIG. 3, with the gas introduction port 18 disposed in the top part of the chamber 12. The evaporation source material for arc-evaporation source 15a was made titanium, while the evaporation source material for arc-evaporation source 15c, disposed on the wall face opposing evaporation source 15a, was made a titanium-aluminum compound (Ti 0.5, Al 0.5), wherein "(Ti 0.5, Al 0.5)" signifies a compound in which the numerical ratio of Ti and Al atoms is 0.5:0.5. The configuration otherwise of the film-deposition device 11 was the same as it was in fabricating Test Sample Nos. 1-1 through 1-8.

The film-deposition device 11 was employed, according to the same technique as with the foregoing Test Sample Nos. 1-1 through 1-8, to sputter the substrate 19 surface with argon and thereafter to sputter it with titanium ions. A TiN film 0.3 μm in thickness was then formed as an intermediate layer on the substrate 19 surface, likewise as with the foregoing Test Sample Nos. 1-1 through 1-8.

After formation of the TiN film was finished, a −40 V, 95 A current was supplied from dc-power supply 16c to arc-evaporation source 15c to cause titanium and aluminum ions to issue from the evaporation source 15c, and nitrogen gas was introduced through the gas introduction port 18. The titanium ions, aluminum ions, and nitrogen gas, reacting on the substrate 19, formed a (Ti 0.5, Al 0.5)N film (wherein "(Ti 0.5, Al 0.5)N" signifies a compound in which the numerical ratio of Ti, Al and N atoms is 0.5:0.5:1) of 3 μm laminar thickness onto the intermediate layer (TiN film) on the substrate 19 surface, yielding Test Sample No. 1-9.

iii. Conventional Product: Test Sample No. 1-10

Test Sample No. 1-10 was fabricated in the same way as was the foregoing No. 1-9. Specifically, the same tool substrate as for the foregoing Test Sample Nos. 1-1 through 1-8 was readied, and the substrate was set into the sample holder 20 in the film-deposition device 11 depicted in FIG. 3, with the gas introduction port 18 disposed in the top part of the chamber 12. The evaporation source material for arc-evaporation source 15a was made titanium, while the evaporation source material for arc-evaporation source 15c, disposed on the wall face opposing evaporation source 15a, was made a titanium-silicon compound (Ti 0.8, Si 0.2), wherein "(Ti 0.8, Si 0.2)" signifies a compound in which the numerical ratio of Ti and Al atoms is 0.8:0.2. The film-deposition device 11, in a configuration likewise as in fabricating the foregoing Test Sample Nos. 1-1 through 1-8, was then employed in the same way as with Test Sample No. 1-9 to sputter the substrate 19 surface with argon and thereafter to sputter it with titanium ions, and furthermore to form on it a TiN film 0.3 μm in thickness as an intermediate layer.

After formation of the TiN film was finished, a −40 V, 95 A current was supplied from dc-power supply 16c to arc-evaporation source 15c to cause titanium and silicon ions to issue from the evaporation source 15c, and nitrogen gas was introduced through the gas introduction port 18. The titanium ions, silicon ions, and nitrogen gas, reacting on the substrate 19, formed a (Ti 0.8, Si 0.2)N film (wherein "(Ti 0.8, Si 0.2)N" signifies a compound in which the numerical ratio of Ti, Si and N atoms is 0.8:0.2:1) of 3 μm laminar thickness onto the intermediate layer (TiN film) on the substrate 19 surface, yielding Test Sample No. 1-10.

iv. Conventional Product: Test Sample No. -11

Test Sample No. 1-11 was fabricated in the same way as was the foregoing No. 1-9. Specifically, the same tool substrate as for the foregoing Test Sample Nos. 1-1 through 1-8 was readied, and the substrate was set into the sample holder 20 in the film-deposition device 11 depicted in FIG. 3, with the gas introduction port 18 disposed in the top part of the chamber 12. The evaporation source material for arc-evaporation source 15a was made titanium; and film-deposition device 11, in a configuration likewise as in fabricating the foregoing Test Sample Nos. 1-1 through 1-8, was then employed in the same way as with Test Sample No. 1-9 to sputter the substrate 19 surface with argon and thereafter to sputter it with titanium ions, and furthermore to form on it a TiN film 0.3 μm in thickness as an intermediate layer.

After formation of the TiN film was finished, a −40 V, 95 A current was supplied from dc-power supply 16a to arc-evaporation source 15a to cause titanium ions to issue from the evaporation source 15a, and methane gas ($CH_4$) and nitrogen gas were introduced through the gas introduction port 18. The titanium ions, methane gas and nitrogen gas, reacting on the substrate 19, formed a Ti(C 0.5, N 0.5) film (wherein "Ti(C 0.5, N 0.5)" signifies a compound in which the numerical ratio of Ti, C and N atoms is 1:0.5:0.5) of 3 μm laminar thickness onto the intermediate layer (TiN film) on the substrate 19 surface, yielding Test Sample No. 1-11.

(2) Tool-Life Evaluation

A continuous dry machining test and an interrupted cutting test were carried out under the conditions set forth in Table II on each of Test Sample Nos. 1-1 through 1-11 obtained according to the foregoing, and the width of relief (flank) wear in the cutting edge was measured. It should be understood that the particle diameters of the chemical-compound particles set forth for Test Sample Nos. 1-1 through 1-8 in Table I were observed under a transmission electron microscope, and the average particle diameters found. It should likewise be understood that the compositions of Test Sample Nos. 1-1 through 1-11 were analyzed with a micro-analytical EDX (energy dispersive X-ray) spectrometer in conjunction with the transmission electron microscope. The compositions could also be identified using XPS (X-ray photoelectron spectroscopy) or SIMS (secondary ion mass spectrometry). The composition (crystallinity) of the coatings as a whole, composed of the second film, and the first film, second film, and intermediate layer, were assayed by X-ray diffraction. The composition (crystallinity) of the first films was assayed by transmission electron diffraction.

TABLE I

| Sample No. | Intermediate layer Film type | Intermediate layer Film thickness (μm) | Coating First film Film type | Coating First film Si qty. (atm. %) | Coating First film Si-based crystallinity | Coating First film Thickness (nm) | Coating Second film Film type | Coating Second film Particle dia. (nm) | Coating Second film Crystallinity | Coating Second film Thickness (nm) | Crystallinity | Compounded thickness | Relief wear (mm) Continuous machining | Relief wear (mm) Interrupted cutting |
|---|---|---|---|---|---|---|---|---|---|---|---|---|---|---|
| 1-1 | TiN | 0.3 | TiSiN | 21 | Amorphous | 4 | CrN | 4 | Cubic | 4 | Cubic | 3.2 | 0.050 | 0.068 |
| 1-2 | Ti | 0.15 | TiSiN | 12 | Amorphous | 11 | TiCrN | 6 | Cubic | 11 | Cubic | 2.2 | 0.051 | 0.077 |
| 1-3 | Cr | 0.06 | TiSiN | 17 | Amorphous | 24 | CrN | 8 | Cubic | 24 | Cubic | 4.8 | 0.087 | 0.089 |
| 1-4 | CrN | 0.3 | TiSiN | 24 | Amorphous | 42 | TiN | 5 | Cubic | 42 | Cubic | 4.2 | 0.078 | 0.082 |
| 1-5 | TiN | 0.22 | TiSiN | 6 | Amorphous | 1.5 | TiCrN | 1 | Cubic | 1.5 | Cubic | 1.5 | 0.088 | 0.082 |
| 1-6 | TiN | 0.3 | TiSiCN | 20 | Amorphous | 5 | CrCN | 4 | Cubic | 5 | Cubic | 3.0 | 0.052 | 0.065 |
| 1-7 | TiN | 0.3 | TiSiC | 20 | Amorphous | 5 | CrC | 4 | Cubic | 5 | Cubic | 3.0 | 0.054 | 0.067 |
| 1-8 | TiN | 0.3 | TiSiCNO | 20 | Amorphous | 5 | CrCNO | 4 | Cubic | 5 | Cubic | 3.0 | 0.052 | 0.070 |
| 1-9 | TiN | 0.3 | TiAlN | — | — | — | — | — | — | — | Cubic | 3.0 | 0.221 | 0.215 |
| 1-10 | TiN | 0.3 | TiSiN | 20 | — | — | — | — | — | — | Cubic | 3.0 | 0.198 | Chipped |
| 1-11 | TiN | 0.3 | TiCN | — | — | — | — | — | — | — | Cubic | 3.0 | 0.247 | 0.237 |

TABLE II

|  | Continuous machining | Interrupted cutting |
|---|---|---|
| Work material | SCM 435 | SCM 435 |
| Cutting speed (m/min) | 250 | 250 |
| Feed rate (mm/rev.) | 0.35 | 0.30 |
| Depth of cut (mm) | 2.0 | 1.5 |
| Machining time (min) | 20 | 30 |

As is indicated in Table I, compared with Test Sample Nos. 1-9 through 1-11, the relief wear in Test Sample Nos. 1-1 through 1-8 was slight, confirming a major improvement in tool life. In particular, with the relief wear being slight even under dry-process machining, it was evident that Test Sample Nos. 1-1 through 1-8 are at the same time wear-resistant and lubricative. Likewise evident was that Test Sample Nos. 1-1 through 1-8 wear-resistant and lubricative even in interrupted cutting. In addition, inspecting the composition of Test Sample Nos. 1-1 through 1-8 showed that in the first films the particles of the Ti-based compounds were dispersed within the amorphous structure of the Si-based compounds.

Embodiment 2

Coatings were made on respective substrate reamers (of JIS K10 cemented carbide) according to the same manufacturing method as in Embodiment 1, whereby Test Sample Nos. 2-1 through 2-6 were produced. Test Sample No. 2-1 was furnished with the same intermediate layer and coating films as those of the foregoing Test Sample No. 1-1. For Test Sample No. 2-2, a 1 μm TiSiN film was coated onto the substrate surface, and onto this film the same coating films as those of the foregoing Test Sample No. 1-1 were furnished. For Test Sample No. 2-3, a 1 μm TiAlN film was coated onto the substrate surface, and onto this film the same coating films as those of the foregoing Test Sample No. 1-1 were furnished. For Test Sample Nos. 2-4 through 2-6, the same intermediate layer and coating films as those of the foregoing Test Sample Nos. 1-9 through 1-11 were furnished onto the respective substrates.

A drilling operation into gray iron (FC 250) was performed with these Test Sample Nos. 2-1 through 2-6 to assess the service life of each. The machining conditions were set as the parameters: reamer diameter 20 mm, cutting speed 5 m/min, feed rate 0.4 mm/rev., depth of cut 0.15 mm, and wet process. To assess service life, the point when the dimensional precision of the hole bored in the work material (gray iron) went out of prescribed range was taken to be the lifespan, and the count of holes until the life was spent was assessed. The results are set forth in Table III.

TABLE III

| Process | Lifespan determination criterion | No. 2-1 | No. 2-2 | No. 2-3 | No. 2-4 | No. 2-5 | No. 2-6 |
|---|---|---|---|---|---|---|---|
| Reaming | Count to loss of dimensional precision | 35,000 | 38,000 | 37,000 | 4,500 | 6,000 | 3,600 |

As is indicated in Table III, a major improvement in service life was confirmed in Test Sample Nos. 2-1 through 2-3, compared with Test Sample Nos. 2-4 through 2-6. The fact that the lifespan can thus be enhanced presumably is on account of the particularly outstanding wear resistance.

Embodiment 3

Coatings were made on respective substrate endmills (of JIS K10 cemented carbide) according to the same manufacturing method as in Embodiment 1, whereby Test Sample Nos. 3-1 through 3-6 were produced. Test Sample No. 3-1 was furnished with the same intermediate layer and coating films as those of the foregoing Test Sample No. 1-1. For Test Sample No. 3-2, a 1 µm TiSiN film was coated onto the substrate surface, and onto this film the same coating films as those of the foregoing Test Sample No. 1-1 were furnished. For Test Sample No. 3-3, a 1 µm TiAlN film was coated onto the substrate surface, and onto this film the same coating films as those of the foregoing Test Sample No. 1-1 were furnished. For Test Sample Nos. 3-4 through 3-6, the same intermediate layer and coating films as those of the foregoing Test Sample Nos. 1-9 through 1-11 were furnished onto the respective substrates.

An endmill horizontal cutting operation (cutting width 15 mm) into spheroidal graphite cast iron (FCD 450) was performed with these Test Sample Nos. 3-1 through 3-6 to assess the service life of each. The machining conditions were set as the parameters: cutting speed 75 m/min, feed rate 0.03 mm/rev., depth of cut 2 mm, and wet process. To assess service life, the point when the dimensional precision of the horizontal cut made in the work material (cast iron) went out of prescribed range was taken to be the lifespan, and the cut length up until the life was spent was assessed. The results are set forth in Table IV.

Embodiment 4

Coatings were made on respective substrate replaceable milling inserts (of JIS P10 cemented carbide; cutting edge form: rake angle 8°, relief angle 6°) according to the same manufacturing method as in Embodiment 1, whereby Test Sample Nos. 4-1 through 4-6 were produced. Test Sample No. 4-1 was furnished with the same intermediate layer and coating films as those of the foregoing Test Sample No. 1-1. For Test Sample No. 4-2, a 1 µm TiSiN film was coated onto the substrate surface, and onto this film the same coating films as those of the foregoing Test Sample No. 1-1 were furnished. For Test Sample No. 4-3, a 1 µm TiAlN film was coated onto the substrate surface, and onto this film the same coating films as those of the foregoing Test Sample No. 1-1 were furnished. For Test Sample Nos. 4-4 through 4-6, the same intermediate layer and coating films as those of the foregoing Test Sample Nos. 1-9 through 1-11 were furnished onto the respective substrates.

An intermediate milling operation on chrome-molybdenum steel (SCM 435) was performed with these Test Sample Nos. 4-1 through 4-6 to assess the service life of each. The machining conditions were set as the parameters: cutting speed 100 m/min, feed rate 0.08 mm/rev., and dry process. To assess service life, the point when the dimensional precision of the intermediate milling on the work material (steel) went out of prescribed range was taken to be the lifespan, and the time period up until the life was spent was assessed. The results are set forth in Table V.

TABLE IV

| Process | Lifespan determination criterion | No. 3-1 | No. 3-2 | No. 3-3 | No. 3-4 | No. 3-5 | No. 3-6 |
|---|---|---|---|---|---|---|---|
| Endmill horizontal cutting | Length to loss of dimensional precision | 20 m | 22 m | 25 m | 2.1 m | 2.8 m | 1.9 m |

TABLE V

| Process | Lifespan determination criterion | No. 4-1 | No. 4-2 | No. 4-3 | No. 4-4 | No. 4-5 | No. 4-6 |
|---|---|---|---|---|---|---|---|
| Intermed. milling operation | Time to loss of dimensional precision | 120 min | 140 min | 130 min | 35 min | 49 min | 27 min |

As is indicated in Table IV, a major improvement in service life was confirmed in Test Sample Nos. 3-1 through 3-3, compared with Test Sample Nos. 3-4 through 3-6. The fact that the lifespan can thus be enhanced presumably is on account of the particularly outstanding wear resistance.

As is indicated in Table V, a major improvement in service life was confirmed in Test Sample Nos. 4-1 through 4-3, compared with Test Sample Nos. 4-4 through 4-6. Moreover, the outstanding wear resistance together with the superior lubricating properties is evident from the fact that the lifespan can be enhanced even under dry conditions.

Embodiment 5

A machining insert in which a cBN sinter was used for a substrate was fabricated and was analyzed for wear. The cBN sinter was produced utilizing a pot and plunger made of cemented carbide to mix a bonding-material powder composed of 40 weight % TiN and 10 weight % Al, with 50 weight % of a cBN powder of 2.5 μm average particle diameter, charging this into a cemented carbide vessel, and sintering it 60 min at a pressure of 5 GPa and a temperature of 1400° C. The machining insert was produced by processing the cBN sinter into ISO-standard SNGA 120408 form. The same intermediate layer and coating films as those of the foregoing Test Sample No. 1-1 were formed in the same way as in Embodiment 1 onto this substrate insert (Test Sample No. 5-1). In addition, the same intermediate layer and coating films as those of the foregoing Test Sample No. 1-9 were formed in the same way as in Embodiment 1 onto this substrate insert to prepare Test Sample No. 5-2 as a comparative example.

Machining on the outer periphery of SUJ2 rods (HRC 62) as one type of tempered steel was performed with these Test Sample Nos. 5-1 and 5-2 to assay the amount of relief wear on each. The machining conditions were set as the parameters: cutting speed 100 m/min, depth of cut 2 mm, feed rate 0.1 mm/rev., and dry process; and the machining was carried out for 30 minutes. The resulting relief wear on Test Sample No. 5-1 was 0.085 mm, whereas the relief wear on Test Sample No. 5-2 was 0.255 mm. Thus the outstanding wear resistance and superior lubricating properties of Test Sample No. 5-1 is evident from the fact that the relief wear is slight even under dry conditions.

As explained above, with a coated tool by the present invention, efficacy in terms of a high degree of hardness and superior wear resistance, together with excellent lubricating properties is demonstrable. Consequently, with tools by the present invention, thanks to the lubricating properties of the tools themselves tool life can be improved even in dry-work processes in which cutting fluids are not employed. The present invention accordingly serves to enhance wear resistance in tools such as drills, endmills, replaceable milling inserts, replaceable turning inserts, metal slitting saws, gear cutting tools, reamers, and taps, and enables the tool life to be improved.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A coated tool comprising:
   a base part;
   a coating furnished on said base part, said coating including, laminated in alternation, one or more layers of each of
   a first film composed of a blend of a first compound selected from nitrides, carbides, carbonitrides, oxynitrides and carboxynitrides of Tl, and a second compound selected from nitrides, carbides, carbonitrides, oxynitrides and carboxynitrides of Si; and
   a second film composed of one compound selected from nitrides, carbides, carbonitrides, oxynitrides and carboxynitrides of one metal M selected from Tl, Cr, and TiCr.

2. A coated tool as set forth in claim 1, wherein said first film and said second film are each 0.5 nm or more and 50 nm or less in thickness.

3. A coated tool as set forth in claim 1, wherein said first film and said second film are each 0.5 nm or more and 10 nm or less in thickness.

4. A coated tool as set forth in any of claims 1 through 3, wherein the Si in said first film is more than 1%, and 30% or less, in atomic weight %.

5. A coated tool as set forth in any of claims 1 through 3, wherein the Si in said first film is more than 15%, and 25% or less, in atomic weight %.

6. A coated tool as set forth in any of claims 1 through 3, wherein:
   in said first film the Ti-based compound is a cubic crystalline structure, and the Si-based compound is an amorphous structure;
   in said second film the metal-M compound is a cubic crystaline structure; and
   assayed by X-ray diction said coating overall is a cubic crystal system.

7. A coated tool as set forth in any of claims 1 through 3, wherein the Ti-based compound in the first film is a crystalline substance whose average grain size is 0.1 nm or more and 10 nm or less, and is dispersed within the amorphous structure of the Si-based compound.

8. A coated tool as set forth in any of claims 1 through 3, wherein said coating is 0.5 μm or more and 10 μm or less in compounded thickness.

9. A coated tool as set forth in any or claims 1 through 3, wherein an intermediate layer is furnished in between said base part superficially and said coating, said intermediate layer being composed of one selected from Ti, TiN, Cr, and CrN.

10. A coated tool as set forth in claim 9, wherein said intermediate layer is preferably 0.05 μm or more and 1.0 μm or less in thickness.

11. A coated tool as set forth in any of claims 1 through 3, wherein said base part is one selected from cemented tungsten carbides, cermets, high-speed steels, ceramics, sinters of cubic boron nitride, diamond sinters, silicon nitride sinters, and sinters containing alumina and titanium carbide.

12. A coated tool as set forth in any of claims 1 through 3, wherein the coated tool is one selected from a drill, endmill, indexable insert for milling, indexable insert for turning, metal slitting saw, gear cutting tool, reamer, and tap.

13. A coated tool as set forth in any of claims 1 through 3, wherein said coating is formed by a physical vapor deposition technique; with a TiSi alloy and a metal M each as an evaporation source material, within a gas containing one or more among nitrogen, carbon and oxygen.

14. A coated tool as set forth in claim 13, wherein:
   the TiSi-alloy evaporation source material utilized in the physical vapor deposition technique is created by hot isostatic pressing and is of 99 to 100% relative density; and
   ranging continuously over the surface of the source material including its countering face there are no defects.

15. A coated tool as set forth in claim 13, wherein the physical vapor deposition technique is an arc-ion plating technique.

16. A coated tool as set forth in claim 14, wherein the physical vapor deposition technique is an arc-ion plating technique.

* * * * *